United States Patent
Zhou et al.

(10) Patent No.: US 8,299,851 B2
(45) Date of Patent: Oct. 30, 2012

(54) HIGH EFFICIENCY LINEAR AMPLIFIER

(75) Inventors: Yijun Zhou, Singapore (SG); Yan Wah Michael Chia, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 126 days.

(21) Appl. No.: 12/736,356

(22) PCT Filed: Mar. 31, 2009

(86) PCT No.: PCT/SG2009/000109
§ 371 (c)(1),
(2), (4) Date: Dec. 15, 2010

(87) PCT Pub. No.: WO2009/123566
PCT Pub. Date: Oct. 8, 2009

(65) Prior Publication Data
US 2011/0102079 A1    May 5, 2011

Related U.S. Application Data

(60) Provisional application No. 61/040,754, filed on Mar. 31, 2008.

(51) Int. Cl.
*H03F 3/38* (2006.01)
(52) U.S. Cl. .......... 330/10; 330/124 R; 330/51; 330/107
(58) Field of Classification Search .................... 330/10, 330/124 R, 51, 107
See application file for complete search history.

(56) References Cited

U.S. PATENT DOCUMENTS

| | | | | |
|---|---|---|---|---|
| 5,365,187 A | * | 11/1994 | Hornak et al. | 330/10 |
| 6,313,703 B1 | * | 11/2001 | Wright et al. | 330/149 |
| 6,819,171 B2 | * | 11/2004 | Kenington | 330/51 |
| 7,095,277 B2 | | 8/2006 | Zhou et al. | |
| 7,737,778 B2 | * | 6/2010 | Saed | 330/149 |
| 2007/0247217 A1 | | 10/2007 | Sorrels et al. | |

* cited by examiner

*Primary Examiner* — Patricia Nguyen
(74) *Attorney, Agent, or Firm* — Axis Intellectual Capital (57) ABSTRACT

A high efficiency linear amplifier is disclosed. The amplifier comprises an input module having an input coupled to receive an input signal, a first output configured to provide a first signal component, and a second output configured to provide a second signal component. The amplifier also comprises a switching module having a switch input coupled to receive a switch signal, a first input coupled to the first output of the input module, a second input coupled to the second output of the input module, and at least a first output configured to provide a first composite signal. The amplifier further comprises an amplifier module having at least a first input coupled to the first output of the switching module and at least a first output, wherein the first and second signal components comprise constant envelope phase varying signals having different phase relationships and which correspond to the input signal, and wherein the first composite signal comprises temporally sequenced portions of the first and second signal components.

28 Claims, 7 Drawing Sheets

HIGH EFFICIENCY LINEAR AMPLIFIER

TECHNICAL FIELD

The present disclosure generally relates to amplifiers. More particularly, the disclosure relates to a high efficiency linear amplifier.

BACKGROUND

Amplifiers such as class A amplifiers and non-linear amplifiers are often used to amplify signals which have a constant envelope. Linear amplifiers have low efficiency, whereas non-linear amplifiers that operate in switching mode are highly efficient. Various conventional amplifiers have been proposed in attempts to achieve linear amplification using non-linear amplifiers instead of linear amplifiers. Examples of such conventional amplifiers are Kahn envelope elimination and restoration (EER) amplifiers, Pulse Width Modulation (PWM) amplifiers and linear amplification with nonlinear components (LINC) amplifiers.

Figure 1:
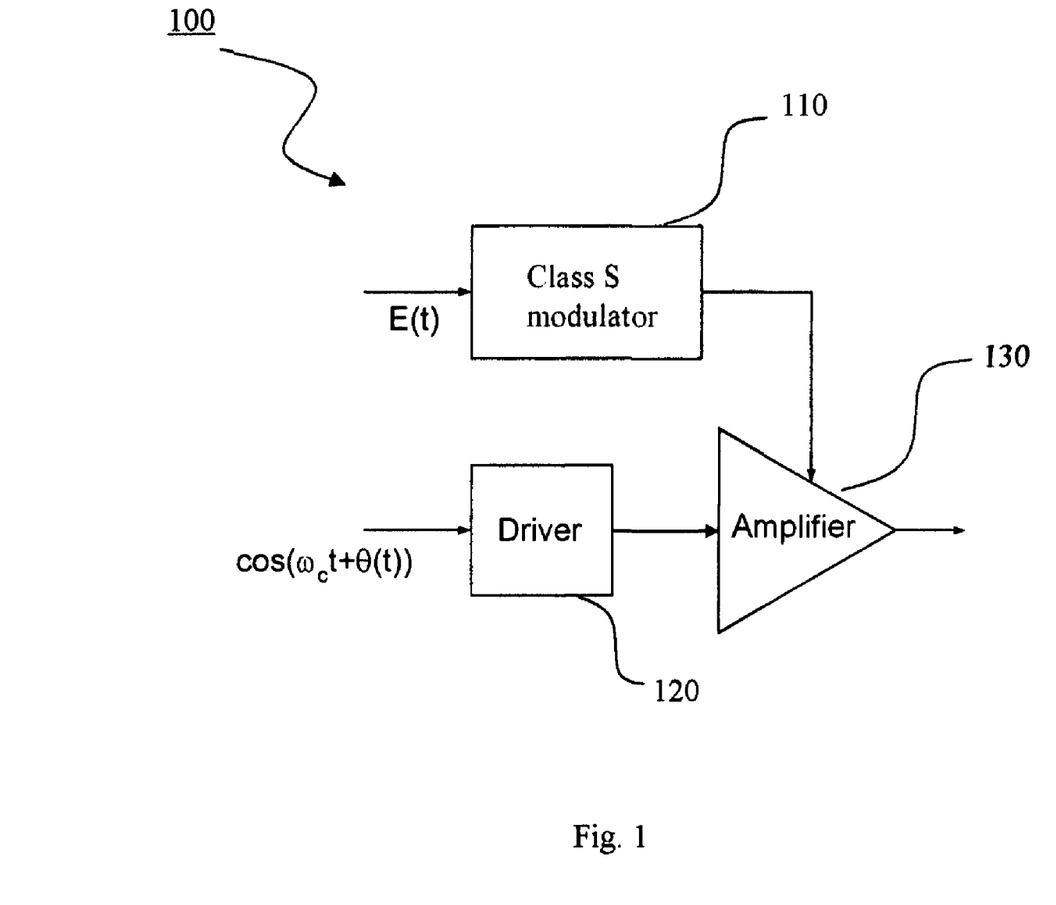
FIG. 1 shows a Kahn envelope elimination and restoration amplifier having an envelope modulator, a driver and a Radio Frequency (RF) power amplifier.

FIG. 1 shows an EER amplifier 100. The EER amplifier 100 includes an envelope modulator 110, a driver 120 and a Radio Frequency (RF) power amplifier 130. Both the envelope modulator 110 and the RF power amplifier have high efficiencies.

A linear modulation signal is separated into a variable envelope modulation signal E(t) and a constant envelope RF phase modulated signal X(t), where $$X(t) = \cos(\omega_c(t) + \theta(t)).$$

The variable envelope modulation signal E(t) and the constant envelope RF phase modulated signal X(t) are processed, respectively, by the envelope modulator 110 and the driver 120 of the EER amplifier 100 and subsequently combined. More specifically, the envelope modulator 110 modulates supply voltage provided to the RF power amplifier 130, which amplifies the constant envelope RF phase modulated signal X(t) via the driver 120.

Although the EER amplifier 100 is highly efficient, its linearity is limited by the bandwidth of the envelope modulator 110, the alignment of the processed variable envelope modulation signal E(t) and the processed constant envelope RF phase modulated signal X(t). Moreover, the envelope modulator 110 requires a low pass filter, which is bulky and is hence not suitable for integration with other systems.

Figure 2:
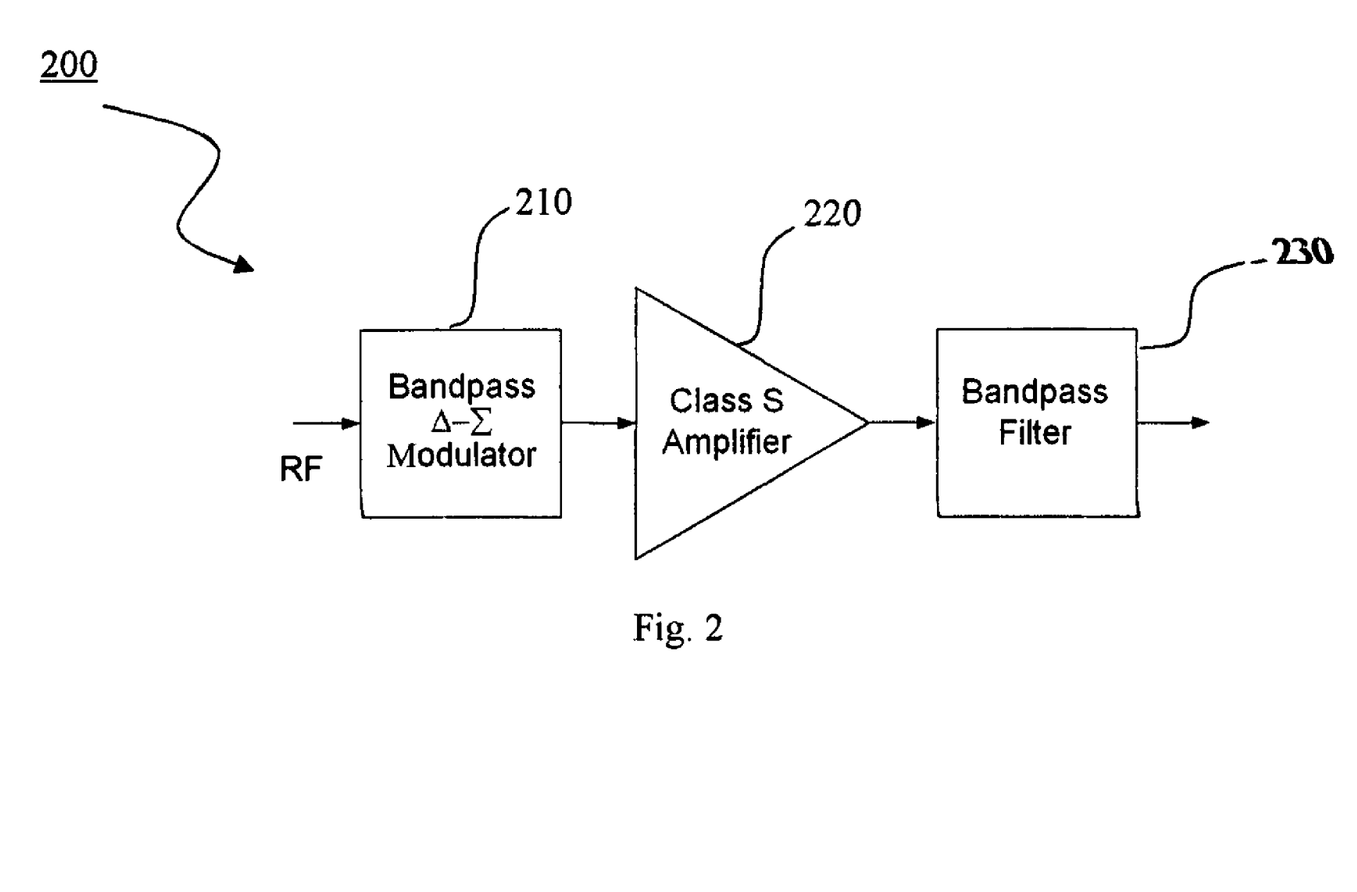
FIG. 2 shows a Pulse Width Modulator amplifier having a bandpass delta-sigma modulator, a class-S power amplifier and a bandpass filter.

FIG. 2 shows a PWM amplifier 200, which is constructed using a bandpass delta-sigma modulator 210, a class-S power amplifier 220 (which is an example of a highly efficient non-linear power amplifier) and a bandpass filter 230. The PWM amplifier 200 modulates the pulsewidth, or pulse density, of a constant envelope signal that is provided to the bandpass delta-sigma modulator 210. The bandpass delta-sigma modulator 210 then generates a PWM signal which is provided to the class-S power amplifier 220 and amplified. The bandpass filter 230 filters out-of-band noises from the class-S power amplifier 220.

The PWM signal is, for example, a single bit digital data stream, therefore the operating clock frequency of the bandpass delta-sigma modulator 210 needs to be high. More specifically, the operating clock frequency needs to be a few times higher, typically four times higher, than that of the central frequency of interest. Hence, the bandwidth of the PWM amplifier 200 is limited.

As the bandpass delta-sigma modulator 210 needs to be operated at high operating clock frequencies, the application of the PWM amplifier 200 for constant envelope signals within higher RF frequency ranges is a problem. Furthermore, at high operating clock frequencies, power consumption of the bandpass delta-sigma modulator 210 is increased. Therefore, the PWM amplifier 200 is not suitable for use in applications where wideband transmission is required. Additionally, the bandpass filter 230 increases size and cost of the PWM amplifier 200. Moreover, amplified signals provided by the class-S power amplifier 220 may also be attenuated by the bandpass filter 230.

Figure 3A:
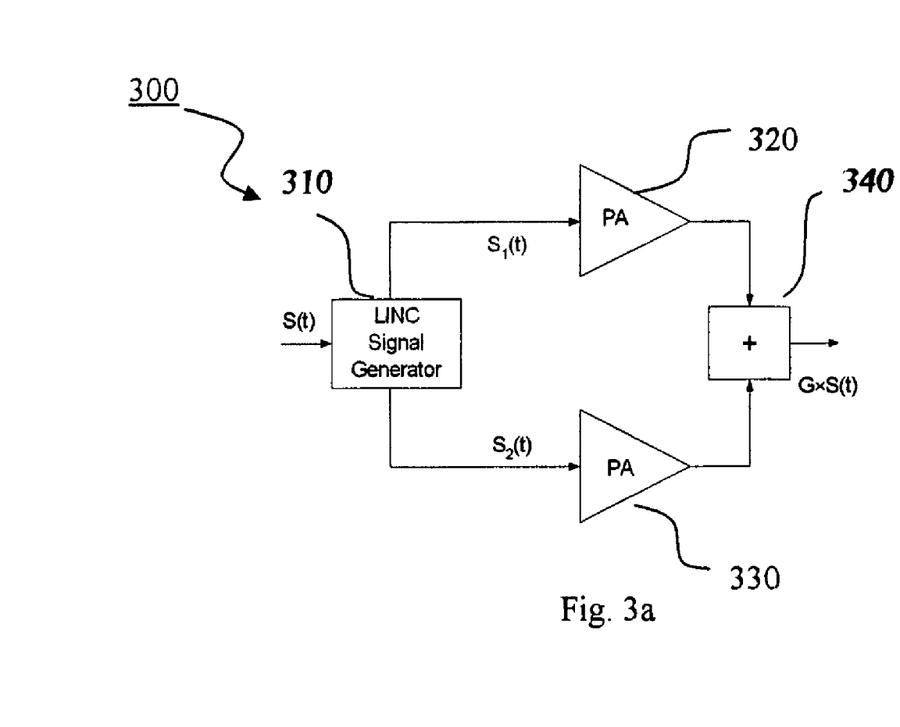
FIG. 3a shows a linear amplification with nonlinear components (LINC) amplifier having a LINC Signal generator (LSG), a first power amplifier, a second power amplifier and a combiner.
Figure 3B:
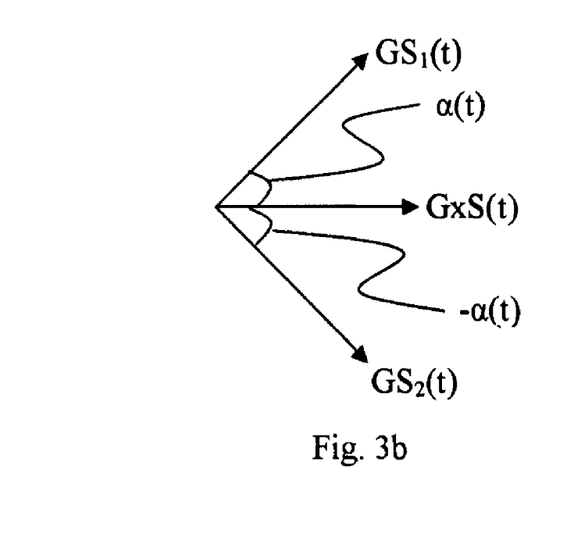

FIG. 3a-b shows a LINC amplifier 300. As shown on FIG. 3a, the LINC amplifier 300 has a LINC Signal generator (LSG) 310, a first power amplifier 320, a second power amplifier 330 and a combiner 340, which is a passive combiner.

The LSG 310 receives input signals S(t) and transforms the input signals S(t) a first signal component $S_1(t)$ and a second signal component $S_2(t)$, each of which are nonlinear constant envelope signals. Each of the first and second power amplifiers 320/330 has an input and an output coupled to the LSG 310 and the combiner 340, respectively. The first and second signal components $S_1(t)/S_2(t)$ are provided to the first and second power amplifiers 320/330, respectively, and amplified, before being provided to the combiner 340. The combiner 340 receives the amplified first and second signal components, which are denoted by symbols $GS_1(t)$ and $GS_2(t)$, respectively, and combines them to produce a linear output signal GxS(t).

Outputs of each of the first and second power amplifiers 320/330 are required to be matched in gain and phase by approximately 0.5 dB and 0.3° respectively. Such requirements are extremely difficult to meet without the use of a complex feedback system.

The efficiency of the LINC amplifier 300 is dependent on the efficiency of first and second power amplifiers 320/330 and the combiner 340. Therefore, the efficiency of the combiner 340 is critical since the first and second power amplifiers 320/330 are high efficient nonlinear amplifiers. The efficiency of the combiner 340 is dependent on the type of combiner used, which is typically an isolated combiner or a Chireix-outphasing combiner. The isolated combiner provides a linear output, however its efficiency is limited. On the other hand, the Chireix-outphasing combiner provides better efficiency but suffers from linearity issues.

The LINC amplifier 300 operates based on vector summing of the phase α(t) of the first and second signal components $S_1(t)/S_2(t)$ as shown in FIG. 3b.

It is therefore desirable to provide a solution for addressing at least one of the foregoing problems of such conventional amplifiers.

SUMMARY

In accordance with an aspect of the invention, an amplifier is provided. The amplifier comprises an input module, a switching module and an amplifier module. The input module has an input coupled to receive an input signal, a first output configured to provide a first signal component, and a second output configured to provide a second signal component. The switching module has a switch input which is coupled to receive a switch signal, a first input coupled to the first output of the input module, a second input coupled to the second output of the input module, and at least a first output configured to provide a first composite signal. The amplifier module has at least a first input which is coupled to the first output of the switching module and at least a first output. The first and second signal components comprise constant envelope phase varying signals having different phase relationships and which correspond to the input signal. The first composite signal comprises temporally sequenced portions of the first and second signal components.

In accordance with another aspect of the invention, an amplifier is provided. The amplifier comprises an input module, a switching module comprising a plurality of switches and an amplifier module. The input module has an input coupled to receive an input signal, a first output configured to provide a first set of signal components, and a second output configured to provide a second set of signal components. The switching module has a first input coupled to the first output of the input module and a second input coupled to the second output of the input module. The switching module also has at least a first output configured to provide one from the group of a first set of composite signals and a first set of composite signal components. The amplifier module has at least a first input coupled to the first output of the switching module and a set of outputs. Each signal within the first set of signal components and each signal within the second set of signal components is a constant envelope phase varying signal. A given composite signal within the set of composite signals and a given composite signal component within the set of composite signal components comprises a temporal sequence of signal component sub-periods within at least one from the group of the first set of signal components and the second set of signal components.

In accordance with yet another aspect of the invention, an amplification method is provided. The amplification method comprises receiving an input signal, generating a plurality of constant envelope phase modulated signal components which correspond to the input signal and temporally sequencing particular portions of signal components within the plurality of signal components to generate at least one composite signal corresponding to the plurality of signal components. The amplification method also comprises amplifying the at least one composite signal.

BRIEF DESCRIPTION OF THE DRAWINGS

Particular embodiments of the disclosure are described hereinafter with reference to the following drawings, in which:

FIG. 3b shows a vector phase diagram of the operation of the LINC amplifier of FIG. 3a;

FIGS. 5a-f show a set of simulation results for the amplifier of FIG. 4a; and

DETAILED DESCRIPTION

Various embodiments of the present disclosure are directed toward structural and functional aspects of a linear amplifier that can be used in applications in which high efficiency amplification is desired, e.g., to reduce or manage power consumption. Such applications include mobile communication systems and portable audio amplification systems.

For purposes of brevity and clarity, aspects of various embodiments of the disclosure are described herein in the context of a linear amplifier. This, however, does not preclude the applicability of various embodiments to other systems, devices, and/or processes where the fundamental principles prevalent among the various embodiments of the disclosure, such as operational, functional or performance characteristics, are desired.

Representative embodiments of the disclosure, hereinafter referred to generally as an amplifier, for addressing one or more problems or limitations associated with conventional amplifiers (e.g., involving one or more considerations above) are detailed hereinafter with reference to FIGS. 4 to 6.

An overview of various structural aspects of particular embodiments of the amplifier is hereinafter provided with respect to FIGS. 4a/b. Representative operational or functional details and modes of operation of the amplifier 400 are also discussed.

Figure 4A:
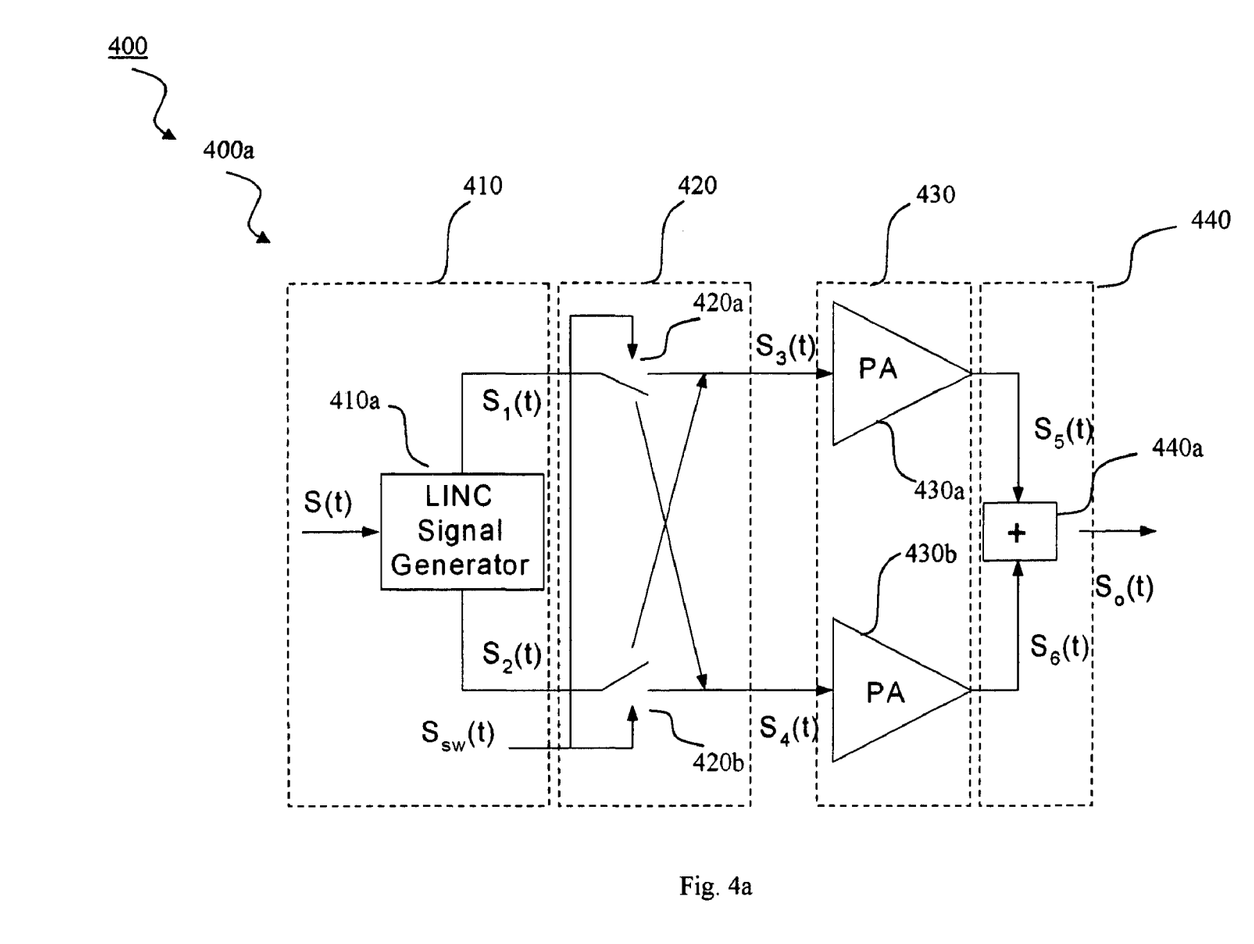
FIG. 4a shows a first amplifier in accordance with an embodiment of the disclosure, the first amplifier including an input module, a switching module, an amplifier module and an output module.
Figure 4B:
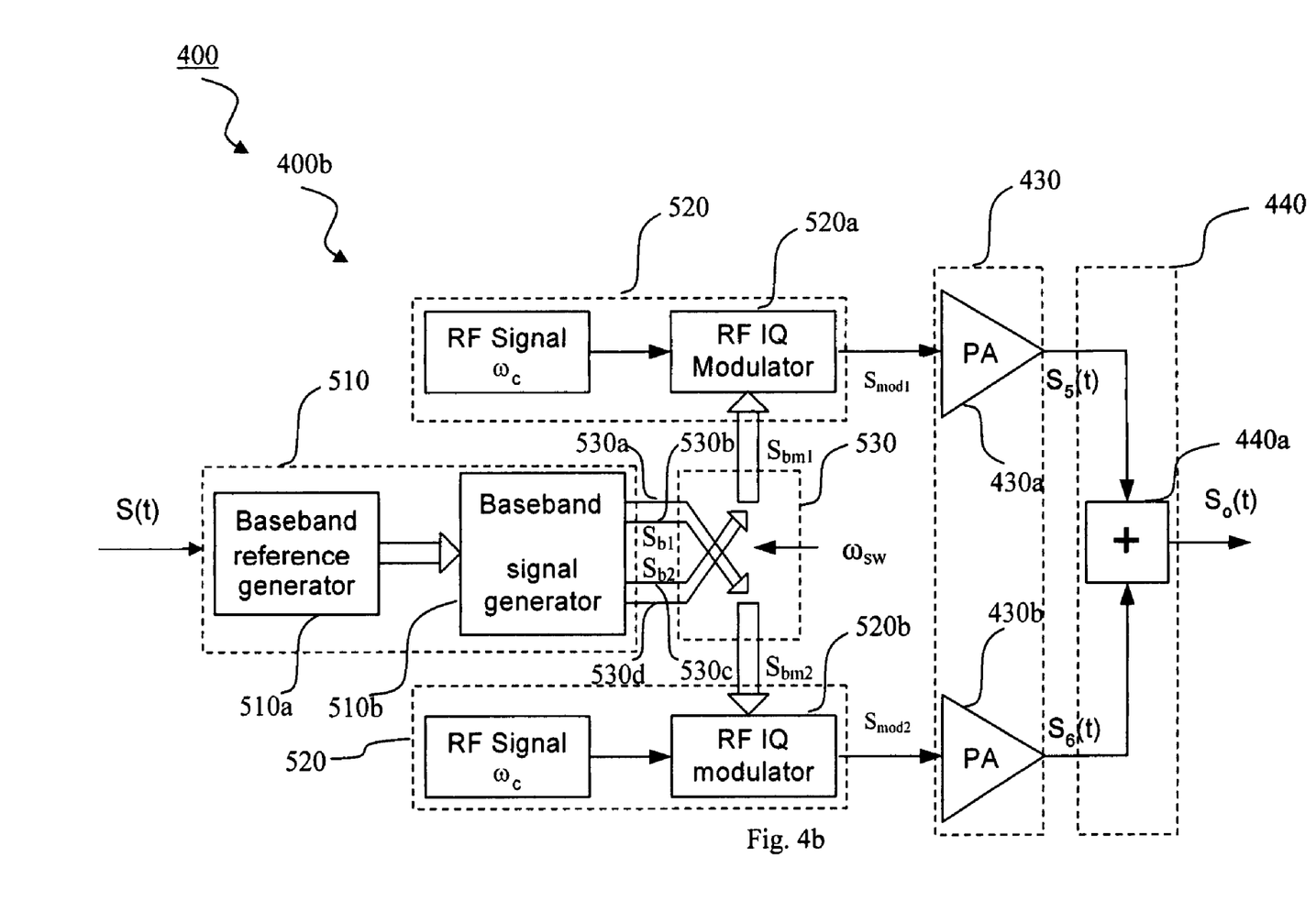
FIG. 4b shows a second amplifier according to an embodiment of the disclosure, the second amplifier including a signal generator module, a modulator module, a baseband switching module, an amplifier module and an output module.

An embodiment 400a of the amplifier 400 is as shown in FIG. 4a, and another embodiment 400b of the amplifier 400 is as shown in FIG. 4b.

In a first embodiment, the amplifier 400 includes an input module 410, a switching module 420, and an amplifier module 430. Depending upon embodiment details, the amplifier 400 can also include an output module 440. The input module 410 includes a signal generator 410a that receives a source or input signal S(t). In one embodiment, the switching module 420 includes a first switch 420a and a second switch 420b. The amplifier module 430 includes at least a first amplifier 430a and can further include a second amplifier 430b. Each of the first and second amplifiers 430a/430b of the amplifier module 430 has an amplification gain factor 'G' and has an input and an output. The output module 440 includes a signal combiner 440a.

At the input module 410, the signal generator 410a receives the input signal S(t) and transforms the input signal S(t) into a first signal component $S_1(t)$ and a second signal component $S_2(t)$. The first and second signal components $S_1(t)/S_2(t)$ are constant envelope phase modulated signals, which in various embodiments have a carrier signal frequency of $\omega_c$, as further detailed below. In some embodiments, the input module 410 can be implemented using a modulator such as a LINC signal generator (e.g., LINC signal component separator circuitry).

The switching module 420 is disposed between the input module 410 and the amplifier module 430, and is coupled to receive the first and second signal components $S_1(t)/S_2(t)$. In one embodiment, the switching module 420 has a switch input that is coupled to receive a switch signal $S_{sw}(t)$ having a frequency of $\omega_{sw}$. The switching module 420 successively and/or selectively couples the first and second signal components $S_1(t)/S_2(t)$ to the amplifier module 430. More specifically, the switching module 420 switches or temporally selects between the first and second signal components $S_1(t)/S_2(t)$ to generate at least a first composite signal $S_3(t)$ and in some embodiments a second composite signal $S_4(t)$. In various embodiments, the switching module 420 thus temporally sequences or interleaves particular sub-periods, portions, segments, fragments, or subdivisions of the first and second signal components $S_1(t)/S_2(t)$ to generate the first and second composite signals $S_3(t)/S_4(t)$. Thus, a given composite signal $S_3(t)/S_4(t)$ is a time division sequence of portions of the first and second signal components $S_1(t)/S_2(t)$. In one embodiment, the switching module 420 can be implemented using a set of analog switches.

The first and second composite signals $S_3(t)/S_4(t)$ are received by the input of the first and second amplifiers 430a/430b respectively, and amplified. In various embodiments, the first and second amplifiers 430a/430b can be implemented using high efficiency nonlinear amplifiers. After amplification by the first and second amplifiers 430a/430b, a first amplified composite signal $S_5(t)$ and a second amplified composite signal $S_6(t)$ are generated. Each of the first and second amplified composite signals $S_5(t)/S_6(t)$ is provided from the output of the first and second amplifiers 430a/430b, respectively, to a corresponding input of the output module's combiner 440a. As a representative example, each of the first and second amplifiers 430a/430b can be a class S amplifier.

The combiner 440a combines the first and second amplified composite signals $S_5(t)/S_6(t)$ to produce a combined output signal $S_o(t)$. In certain embodiments, the combiner 440a can be implemented using a LINC signal combiner.

To aid understanding, representative functional and operational aspects of certain embodiments of the disclosure are considered below. More specifically, a first representative mode of operation and a second representative mode of operation of the first amplifier embodiment 400a are discussed hereinafter.

In the first representative mode of operation, the input signal $S_i(t)$ can be represented by first equation (1) as follows, $$S_i(t)=E(t)\cos[\omega_c t+\phi(t)] \quad (1)$$

The symbol 'E(t)' denotes instantaneous amplitude of the input signal $S_i(t)$ with respect to time.

The first and second signal components $S_1(t)/S_2(t)$ can be represented by second equation (2) and third equation (3) as follows, $$S_1(t)=E_{max}\cos[\omega_c t+\phi(t)+\alpha(t)] \quad (2)$$

$$S_2(t)=E_{max}\cos[\omega_c t+\phi(t)-\alpha(t)] \quad (3)$$

Symbols $E_{max}$ and $\alpha(t)$ as shown in the second and third equations (2)/(3) denote, respectively, the maximum amplitude of the input signal $S_i(t)$ and the phase of each of the first and second signal components $S_1(t)/S_2(t)$. The phase $\alpha(t)$ of each of the first and second signal components $S_1(t)/S_2(t)$ can be represented by fourth equation (4) below, $$\alpha(t)=\cos^{-1}(E(t)/E_{max}) \quad (4)$$

The relationship between the input signal $S_i(t)$ and the first and second signal components $S_1(t)/S_2(t)$ is as shown in fifth equation (5) below, $$S_i(t)=[S_1(t)+S_2(t)]/2 \quad (5)$$

The phase $\alpha(t)$ of each of the first and second signal components $S_1(t)/S_2(t)$ selected by the switching module 420 changes in polarity as the switching module 420 switches between the first and second signal components $S_1(t)/S_2(t)$. Hence, the speed or frequency at which the switching module 420 switches between the first and second signal components $S_1(t)/S_2(t)$ defines a rate or frequency at which the phase $\alpha(t)$ of each of the first and second signal components $S_1(t)/S_2(t)$ changes in polarity.

Therefore, the change in polarity of the phase $\alpha(t)$ with respect to the switching module 420 switching between the first and second signal components $S_1(t)/S_2(t)$ can be considered as a square wave signal SGN(t) that can generally be represented by a equation (6) below, $$SGN(t)=\sum_{n=1}^{\infty} A_n \cos(^n\omega_{sw} t) \quad (6)$$

The square wave signal SGN(t) includes a series of harmonic components, where in the above equation '$A_n$' and 'n' respectively denote an amplitude corresponding to an $n^{th}$ harmonic of the square wave SGN(t). In various embodiments, the square wave SGN(t) is either a positive numerical value one (+1) or a negative numerical value one (−1). The symbol '$\omega_{sw}$' is the frequency of the square wave signal SGN(t), and represents the frequency (or equivalently, speed) at which the switching module 420 switches or selects between the first and second signal components $S_1(t)/S_2(t)$.

The first composite signal $S_3(t)$ and the second composite signal $S_4(t)$ can therefore be represented by seventh (7) and eighth (8) equations as follows, $$S_3(t)=E_{max}\cos[\omega_c t+\phi(t)+SGN(t)\alpha(t)] \quad (7)$$

$$S_4(t)=E_{max}\cos[\omega_c t+\phi(t)-SGN(t)\alpha(t)] \quad (8)$$

The first and second amplified composite signals $S_5(t)/S_6(t)$ can be represented by ninth equation (9) and tenth equation (10) as follows, $$S_5(t) = GE_{max}\cos[\omega_c t+\phi(t)+SGN(t)\alpha(t)] \quad (9)$$
$$= GE_{max}\{\cos[\omega_c t+\phi(t)]\cos[\alpha(t)] -$$
$$\sin[\omega_c t+\phi(t)]\sin[\alpha(t)]\sum_{n=1}^{\infty} A_n\cos(n\omega_{sw}t)\}$$

$$S_6(t) = GE_{max}\cos[\omega_c t+\phi(t)-SGN(t)\alpha(t)] \quad (10)$$
$$= GE_{max}\{\cos[\omega_c t+\phi(t)]\cos[\alpha(t)] +$$
$$\sin[\omega_c t+\phi(t)]\sin[\alpha(t)]\sum_{n=1}^{\infty} A_n\cos(n\omega_{sw}t)\}$$

The combined output signal $S_o(t)$, being a recombination of the first and second amplified composite signals $S_5(t)/S_6(t)$, can be represented by eleventh equation (11) as follows, $$S_o(t)=S_5(t)+S_6(t)=2GE_{max}\cos[\omega_c t+\phi(t)]=2GS_i(t) \quad (11)$$

As is apparent from the eleventh equation, the combined output signal $S_o(t)$ represents an amplification of the input signal $S_i(t)$. More particularly, the combined output signal $S_o(t)$ has a linear relationship with respect to the input signal $S_i(t)$.

As indicated by the foregoing, the combined output signal $S_o(t)$ is linear with respect to the input signal $S_i(t)$ as a result of combining the first and second amplified composite signals $S_5(t)/S_6(t)$. However, in various embodiments, linearity of the combined output signal $S_o(t)$ with respect to the input signal $S_i(t)$ is also achievable without combining the first and second amplified composite signals $S_5(t)/S_6(t)$. This is illustrated by another representative mode of operation of the amplifier of the present disclosure, as provided hereinafter.

With reference to the ninth and tenth equations (9)/(10), the output of each amplifier branch depicted in FIG. 4a corresponds to the input signal S(t) and the mixed components of $\omega_c$ and $\omega_{sw}$. It can be shown that by proper selection of the square wave signal SGN(t) frequency $\omega_{sw}$ and the carrier signal frequency $\omega_c$, the mixed components of frequencies $\omega_{sw}$ and $\omega_c$ can be substantially displaced from the carrier signal frequency $\omega_c$. More specifically, where a selection is made such that the square wave signal SGN(t) frequency $\omega_{sw}$ and the carrier signal frequency $\omega_c$ are equal, and where harmonics of the square wave signal SGN(t) are even, the mixed components of the square wave signal SGN(t) and the carrier signal are substantially displaced from the carrier signal frequency $\omega_c$.

Because the mixed components formed are substantially displaced from the carrier signal frequency $\omega_c$, such mixed components can be readily or selectively filtered through the use of appropriate filtering circuits, devices, and/or techniques. For example, a tuned circuit such as a tank circuit or a filter such as a band pass filter can used for filtering particular or essentially all mixed components generated. Therefore, linearity of the combined output signal $S_o(t)$ with respect to the input signal $S_i(t)$ is achievable via either the first amplifier 430a or the second amplifier 430b. It is therefore not necessary to combine the first and second amplified composite signals $S_5(t)/S_6(t)$ to achieve linearity of the output signal $S_o(t)$ with respect to the input signal $S_i(t)$. As a result of the foregoing, in various embodiments power consumption can be reduced and/or amplifier design can be simplified.

Additionally, a low pass filter can be used to filter the carrier signal frequency $\omega_c$ and its harmonics. In one such embodiment, only a particular set or range of low frequency signals, such as signals displaced around a Direct Current (DC) component, are amplified by the amplifier module 430. Examples of such low frequency signals include audio frequency signals. Therefore, in various embodiments, the amplifier 400 is suitable for use as an audio amplifier.

FIG. 5a to FIG. 5f show a set of representative simulation results corresponding to the amplifier 400, where the first and second amplifiers 430a/430b of the amplifier 400 are class S amplifiers. In FIGS. 5a-5f, the square wave signal SGN(t) frequency $\omega_{sw}$ and the carrier signal frequency $\omega_c$ are both one gigahertz (1 GHz) and the phase $\alpha(t)$ relationship between each of the first and second signal components $S_1(t)/S_2(t)$ is $\pi/4$. The initial phase of the square wave signal SGN(t) frequency $\omega_{sw}$ is zero.

Figure 5A:
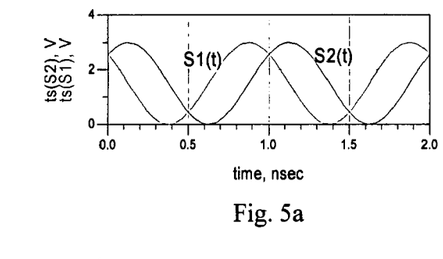
Figure 5B:
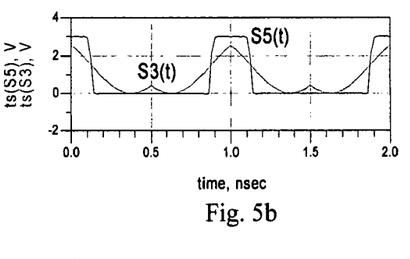
Figure 5C:
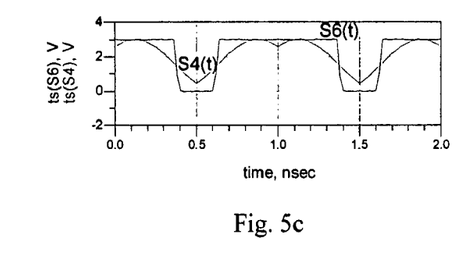
Figure 5D:
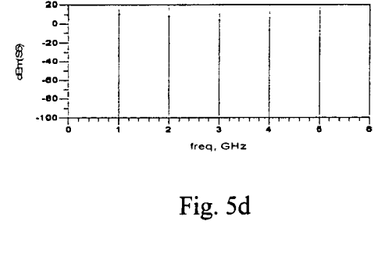
Figure 5E:
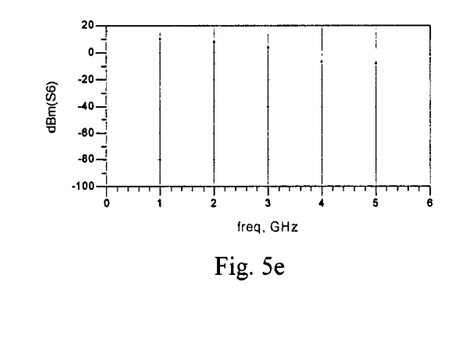

Representative simulated waveforms of the first and second signal components $S_1(t)/S_2(t)$ are shown in FIG. 5a. FIG. 5b shows representative simulated waveforms of the first and second composite signals $S_3(t)/S_4(t)$, and FIG. 5c shows representative simulated waveforms of the first and second amplified composite signals $S_5(t)/S_6(t)$. FIG. 5d shows a representative frequency spectrum of the first amplified composite signal $S_5(t)$ and FIG. 5e shows a representative frequency spectrum of the second amplified composite signal $S_6(t)$.

Figure 5F:
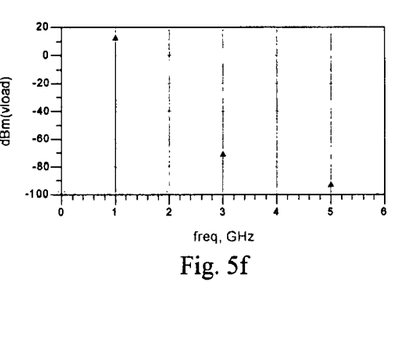

FIG. 5f shows the combined output signal $S_o(t)$ where the even harmonics of the first amplified composite signal $S_5(t)$ are compensated for by the even harmonics of the second amplified composite signal $S_6(t)$. Therefore, the frequency spectrum of the combined output signal $S_o(t)$ comprises only odd harmonics. With such even harmonic compensation, design of output filters for the amplifier 400 is simplified.

In addition or as an alternative to the foregoing, various aspects of particular embodiments of the present disclosure can be applied in situations involving baseband switching. As a representative example, another embodiment of an amplifier according to the present disclosure is considered hereafter.

FIG. 4b shows a second embodiment 400b of an amplifier 400 according to the present disclosure. The second embodiment 400b includes a signal generator module 510, a modulator module 520, a baseband switching module 530, and an amplifier module 430. The second embodiment 400b can also include an output module 440. Relative to FIG. 4a, like reference numbers can indicate like or analogous structural and/or functional elements. Overall, the signal generator module 510 can correspond to a type of input module 410.

In one embodiment, the signal generator module 510 includes a baseband reference generator 510a and a baseband signal generator 510b. The baseband reference generator 510a can include, for example, a quadrature signal generator for producing baseband In-Phase/Quadrature-Phase (IQ) signals. The baseband signal generator 510b can further include a quadrature modulator that is coupled to receive an input baseband signal S(t) and the IQ signals, and which generates a set of switching baseband signals. More particularly, the I and Q signals are provided by the baseband reference generator 510a to the baseband signal generator 510b, which transforms or modulates the I and Q signals in accordance with the input baseband signal S(t) into first baseband signal components $S_{b1}$ and second baseband signal components $S_{b2}$ that are received by the baseband switching module 530.

The baseband switching module 530 can include a first baseband switch 530a, a second baseband switch 530b, a third baseband switch 530c and a fourth baseband switch 530d. The first and second baseband switches 530a/530b form a first ganged switch pair. The third and fourth baseband switches 530c/530d form a second ganged switch pair.

The baseband switching module 530 gang switches between the first and second baseband signal components $S_{b1}/S_{b2}$, forming first composite baseband signal components $S_{bm1}$ and second composite baseband signal components $S_{bm2}$.

The modulator module 520 can include a first modulator 520a and a second modulator 520b. The first and second modulators 520a/520b receive the first and second composite baseband signal components $S_{bm1}/S_{bm2}$ and further receive a carrier signal that has a carrier signal frequency $\omega_c$. In various embodiments, the carrier signal is a Radio Frequency (RF) signal. The first and second modulators 520a/520b modulate the carrier signal in accordance with the first and second composite baseband signal components $S_{bm1}/S_{bm2}$, respectively, to produce a first modulated signal $S_{mod1}$ and a second modulated signal $S_{mod2}$.

The first and second modulated signals $S_{mod1}/S_{mod2}$ are subsequently received and amplified by the amplifier module 430 (e.g., by at least the first and possibly the second amplifiers 430a/430b, respectively). Finally, in some embodiments the amplified first and second modulated signals are subsequently combined at the signal combiner 440a.

Figure 6:
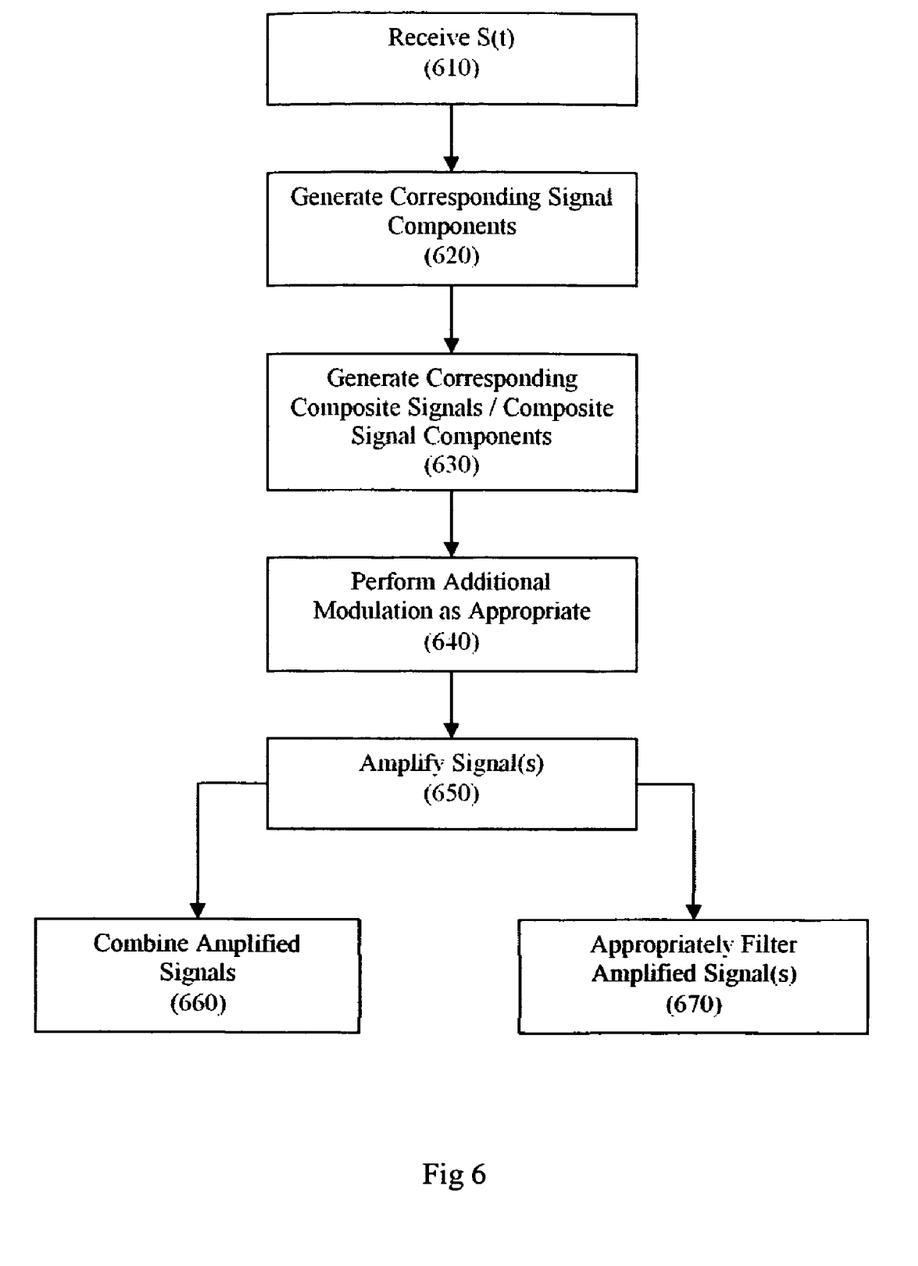
FIG. 6 is a flow diagram of a linear amplification process according to an embodiment of the disclosure.

FIG. 6 is a flow diagram of a process 600 for linear amplification according to an embodiment of the disclosure. In one embodiment, the process 600 includes a first process portion 610 that includes receiving an input RF or baseband signal S(t) (e.g., at an input module 420 or a signal generator module 510). A second process portion 620 includes generating a plurality of constant envelope phase modulated signal components corresponding to S(t). The second process portion 620 can involve high frequency or baseband modulation, depending upon embodiment details. A third process portion 630 includes switching, temporally interleaving, or sequentially selecting particular sub-periods or portions of the signal components to generate a plurality of composite signals or composite signal components.

If applicable or desirable, additional modulation using the composite signals or composite signal components can be performed in the context of a fourth process portion 640. Such modulation can involve an RF modulation of baseband signals, in a manner identical or analogous to that described above.

A fifth process portion 650 includes amplifying at least one set of composite signals, composite signal components, or modulated composite signal components. The fifth process portion 650 can involve, for instance, an amplification module 430 that includes one or more nonlinear power amplifiers 430a/430b.

In one embodiment, a sixth process portion 660 includes combining signals that were amplified in association with the fifth process portion 640 to generate an output signal having a linear relationship with the input signal S(t). The sixth process portion 660 may be performed in the event, for example, that a signal combiner is present. In another embodiment, a seventh process portion 670 includes appropriately filtering one or more signals that were amplified in association with the fifth process portion 640 to generate an output signal that is linearly related to the input signal S(t). The seventh process portion 670 may be performed in the event that a signal combiner is absent.

In view of the preceding description, one or more problems or limitations associated with conventional amplifiers can be mitigated. By incorporating an appropriate type of switching structure such as the above switching module 420 or baseband switching module 530 into an amplifier designed in accordance with the present disclosure, power consumption can be reduced in comparison with conventional amplifiers (e.g., the conventional EER, PWM, and LINC amplifiers 100/200/300 previously described). Such reduced power consumption can prolong battery lifespan or recharging interval in battery operated devices or systems. Moreover, the inclusion of an appropriate type of switching structure into an amplifier in accordance with the present disclosure can result in design simplification, simplified integration with other systems, and cost reduction.

While features, functions, advantages, and alternatives associated with certain embodiments of the disclosure have been described herein within the context of those embodiments, other embodiments may also exhibit such advantages, and not all embodiments need necessarily exhibit such advantages to fall within the scope of the disclosure. It will be appreciated that several of the above-disclosed and other structures, features and functions, or alternatives thereof, may be desirably combined into other different devices, systems, or applications. The above-disclosed structures, features and functions, or alternatives thereof, as well as various presently unforeseen or unanticipated alternatives, modifications, variations, or improvements therein that may be subsequently made by those skilled in the art, are intended to be encompassed by the following claims.

The invention claimed is:

1. An amplifier comprising:
an input module having an input coupled to receive an input signal, a first output configured to provide a first signal component, and a second output configured to provide a second signal component;
a switching module having a switch input coupled to receive a switch signal, a first input coupled to the first output of the input module, a second input coupled to the second output of the input module, and at least a first output configured to provide a first composite signal; and
an amplifier module having at least a first input coupled to the first output of the switching module and at least a first output,
wherein the first and second signal components comprise constant envelope phase varying signals having different phase relationships and which correspond to the input signal, and
wherein the first composite signal comprises temporally sequenced portions of the first and second signal components.

2. The amplifier of claim 1, wherein the switching module comprises:
a first switch having an input coupled to the first output of the input module and an output coupled to the first switching module output; and
a second switch having an input coupled to the second output of the input module and an output coupled to the first switching module output.

3. The amplifier of claim 1, wherein the switching module has a second output configured to provide a second composite signal that comprises temporally sequenced portions of the first and second signal components and which is distinct from the first composite signal.

4. The amplifier of claim 3, wherein the amplifier module has a second input coupled to the second output of the switching module and a second output.

5. The amplifier of claim 4, further comprising a signal combiner having a first input and a second input respectively coupled to the first output and the second output of the amplifier module, and an output configured to provide an output signal.

6. The amplifier of claim 5, wherein the output signal provided by the signal combiner and the input signal received by the input module have a linear relationship.

7. The amplifier of claim 1, wherein the input module comprises a modulator that generates a carrier signal having a carrier frequency $\omega_c$.

8. The amplifier of claim 7, wherein the input module comprises a LINC signal generator.

9. The amplifier of claim 1, further comprising a bandpass filter having an input coupled to the first output of the amplifier module and an output configured to provide an output signal having a linear relationship with the input signal received by the input module.

10. The amplifier of claim 1, further comprising a low pass filter having an input coupled to the first output of the amplifier module and an output configured to provide an output signal having a linear relationship with the input signal received by the input module.

11. The amplifier of claim 10, wherein the input signal is an audio signal.

12. The amplifier of claim 1, wherein a single period of the first composite signal comprises one half period of the first signal component and one half period of the second signal component.

13. The amplifier of claim 1, wherein the switch signal and the first signal component have an identical frequency.

14. An amplifier comprising:
an input module having an input coupled to receive an input signal, a first output configured to provide a first set of signal components, and a second output configured to provide a second set of signal components;
a switching module comprising a plurality of switches, the switching module having a first input coupled to the first output of the input module, a second input coupled to the second output of the input module, and at least a first output configured to provide one from the group of a first set of composite signals and a first set of composite signal components; and
an amplifier module having at least a first input coupled to the first output of the switching module and a set of outputs,
wherein each signal within the first set of signal components and each signal within the second set of signal components is a constant envelope phase varying signal, and wherein a given composite signal within the set of composite signals and a given composite signal component within the set of composite signal components comprises a temporal sequence of signal component subperiods within at least one from the group of the first set of signal components and the second set of signal components.

15. The amplifier of claim 14, wherein the switching module comprises a first switch and a second switch.

16. The amplifier of claim 14, wherein the switching module has a second output configured to provide one from the group of a second set of composite signals and a second set of composite signal components.

17. The amplifier of claim 14, wherein the input module comprises a baseband signal generator.

18. The amplifier of claim 14, wherein the switching module comprises at least one ganged switch pair.

19. The amplifier of claim 14, further comprising a modulator module having a carrier signal input, an input coupled to the first output of the switching module, and at least one output coupled to an input of the amplifier module.

20. The amplifier of claim 19, wherein the modulator module comprises an RF modulator.

21. The amplifier of claim 14, wherein
the set of amplifier module outputs includes a first output and a second output, and
the amplifier further comprises a signal combiner having a first input coupled to the first output of the amplifier module, a second input coupled to the second output of the amplifier module, and an output configured to provide an output signal.

22. The amplifier of claim 21, wherein the output signal provided by the signal combiner and the input signal received by the input module have a linear relationship.

23. The amplifier of claim 14, further comprising:
a set of filters having an input coupled to the set of amplifier module outputs and an output configured to provide an output signal,
wherein the output signal provided by the set of filters and the input signal have a linear relationship.

24. An amplification method comprising:
receiving an input signal;
generating a plurality of constant envelope phase modulated signal components corresponding to the input signal;
temporally sequencing particular portions of signal components within the plurality of signal components to generate at least one composite signal corresponding to the plurality of signal components; and
amplifying the at least one composite signal.

25. The method of claim 24, wherein
the plurality of signal components has a first frequency, and
temporally sequencing particular portions of signal components within the plurality of signal components occurs at the first frequency.

26. The method of claim 24, wherein temporally sequencing particular portions of signal components within the plurality of signal components comprises generating a plurality of composite signals.

27. The method of claim 24, further comprising:
amplifying the plurality of composite signals; and
combining the amplified plurality of composite signals to produce an output signal,
wherein the output signal and the input signal have a linear relationship.

28. The method of claim 24, further comprising filtering the amplified composite signal to produce an output signal, wherein the output signal and the input signal have a linear relationship.

* * * * *